United States Patent
Ishikawa (10) Patent No.: US 11,324,124 B2
(45) Date of Patent: May 3, 2022

(54) LEAD COMPONENT CLINCHING AND MOUNTING METHOD

(71) Applicant: FUJI CORPORATION, Chiryu (JP)

(72) Inventor: Nobuyuki Ishikawa, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 155 days.

(21) Appl. No.: 16/779,202

(22) Filed: Jan. 31, 2020

(65) Prior Publication Data
US 2020/0245471 A1 Jul. 30, 2020

Related U.S. Application Data

(62) Division of application No. 15/312,037, filed as application No. PCT/JP2014/063285 on May 20, 2014, now Pat. No. 10,617,013.

(51) Int. Cl.
*H05K 3/30* (2006.01)
*H05K 13/04* (2006.01)

(52) U.S. Cl.
CPC ......... *H05K 3/306* (2013.01); *H05K 13/0408* (2013.01); *H05K 13/0473* (2013.01)

(58) Field of Classification Search
CPC .... H05K 3/306; H05K 3/325; H05K 13/0408; H05K 13/0473
See application file for complete search history.

(56) References Cited

U.S. PATENT DOCUMENTS

| 2,893,010 A | 7/1959 | Stuhre | |
| 2,896,213 A * | 7/1959 | Cardani | H05K 13/0443 29/566.3 |
| 2,964,749 A | 12/1960 | Kwasniewski | |
| 3,907,008 A | 9/1975 | Bates | |
| 4,215,469 A * | 8/1980 | Asai | B23P 19/00 29/835 |

(Continued)

FOREIGN PATENT DOCUMENTS

| FR | 2569936 A1 * | 3/1986 | ......... H05K 13/0473 |
| JP | 60-131138 A | 7/1985 | |

(Continued)

OTHER PUBLICATIONS

Extended European Search Report issued in Patent Application No. 14892370.9 dated Apr. 6, 2017.

(Continued)

*Primary Examiner* — Jeffrey T Carley
(74) *Attorney, Agent, or Firm* — Oblon, McClelland, Maier & Neustadt, L.L.P.

(57) ABSTRACT

A lead component mounting method includes: a component insertion process in which two lead wires are inserted into two corresponding through-holes which are formed in a circuit board from one side of the circuit board in a state in which at least a pair of pawl portions pinches and holds each of the two lead wires which are included in a lead component; and a clinching process in which protruding portions, which are portions protruding from another side of the circuit board, of the two lead wires which are inserted into the two corresponding through-holes, are bent in a state in which the two lead wires are held by at least the pair of pawl portions.

1 Claim, 9 Drawing Sheets

(56) References Cited

U.S. PATENT DOCUMENTS

| | | | |
|---|---|---|---|
| 4,218,817 A * | 8/1980 | Takano | H05K 13/0473 |
| | | | 29/715 |
| 4,287,668 A | 9/1981 | Asai | |
| 4,329,776 A | 5/1982 | Mori | |
| 4,557,044 A | 12/1985 | Crowman | |
| 4,817,272 A | 4/1989 | Campisi | |
| 6,609,295 B1 * | 8/2003 | Koyama | H05K 13/0473 |
| | | | 29/832 |
| 6,671,946 B1 | 1/2004 | Kadota | |
| 2006/0164794 A1 * | 7/2006 | Kadota | H05K 13/0413 |
| | | | 361/600 |

FOREIGN PATENT DOCUMENTS

| | | |
|---|---|---|
| JP | 2-49558 B2 | 10/1990 |
| JP | 5-175696 A | 7/1993 |
| JP | 11-289193 A | 10/1999 |
| JP | 2002-261493 A | 9/2002 |

OTHER PUBLICATIONS

International Search Report issued in PCT/JP2014/063285 dated Aug. 12, 2014.

* cited by examiner

LEAD COMPONENT CLINCHING AND MOUNTING METHOD

CROSS-REFERENCE TO RELATED APPLICATIONS

This application is a division of U.S. application Ser. No. 15/312,037 filed Nov. 17, 2016, the entire contents of which is incorporated herein by reference. U.S. application Ser. No. 15/312,037 is a 371 of International Application No. PCT/JP2014/063285 filed May 20, 2014.

TECHNICAL FIELD

The present application relates to a lead component mounting machine which mounts lead components onto a circuit board to assemble an electronic circuit.

BACKGROUND ART

PTL 1 and PTL 2 describe a lead component mounting machine provided with a component insertion device which inserts a lead wire of a lead component into a through-hole of a circuit board from one side, and a cut-and-clinch device which cuts and bends a protruding portion of the lead wire which protrudes from the other side of the circuit board.

In the lead component mounting machine described in PTL 1, a lead wire of an axial lead component is held by a chuck on portions facing both sides of a component main body, and is inserted into a through-hole. In a state in which the lead wire and the component main body are held by the chuck, the protruding portion of the lead wire is cut and bent from the other side. In the lead component mounting machine described in PTL 2, the lead wire of the lead component is held in a state of being pinched by a pair of pawl portions, and is inserted into a through-hole. Subsequently, the holding by the pair of pawl portions is released, and the component main body is pushed downward by a pushing-in device. In a state in which the component main body is pushed in by the pushing-in device, the protruding portion of the lead wire is cut and bent.

CITATION LIST

Patent Literature

PTL 1: JP-A-5-175696
PTL 2: JP-A-2002-261493

SUMMARY

The task of the present disclosure is to suppress the load which is borne by the lead component in a case in which the lead wire of the lead component is cut and clinched.

In a lead component mounting machine according to the present disclosure, a lead wire is cut and clinched in a state of being pinched from both sides by pawl portions.

A tensile force is applied to the lead wire, caused by the cut-and-clinch operation; however, since the lead wire is in a state of being pinched from both sides by the pawl portions, the tensile force is rendered difficult to transmit to the component main body side of the lead component. As a result, it is possible to reduce the tensile force which is applied to an attachment section of the lead wire of the component main body, and it is possible to suppress the load borne by the lead component.

DESCRIPTION OF EMBODIMENTS

Hereinafter, description will be given of an embodiment of the present disclosure with reference to the drawings. In addition to the embodiment described below, it is possible to embody the present disclosure with various modifications and improvements based on the knowledge of a person skilled in the art.

Figure 1:
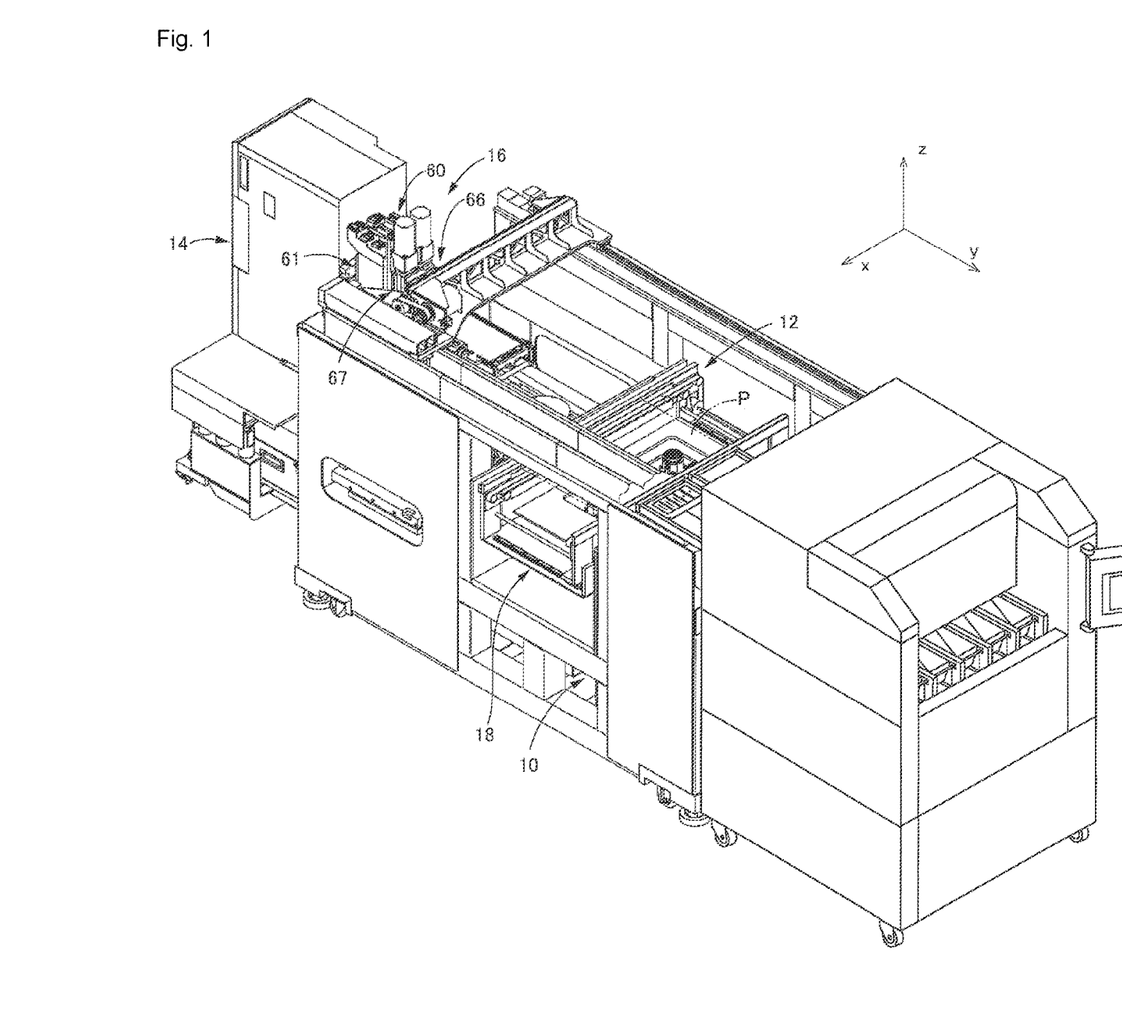
FIG. 1 is a perspective view illustrating a lead component mounting machine which is an embodiment of the present disclosure. In the present lead component mounting machine, the lead component mounting method which is an embodiment of the present disclosure is carried out.

As illustrated in FIG. 1, the lead component mounting machine which is a type of automated assembly apparatus includes (a) an assembly apparatus main body 10, (b) a board conveyance device 12, (c) a component supplying device 14, (d) a component insertion device 16, (e) a cut-and-clinch device 18, and the like.

The board conveyance device 12 conveys and holds a circuit board P (hereinafter, briefly referred to as board P) in a horizontal posture. In FIG. 1, x is a conveyance direction of the board P by the board conveyance device 12, y is a width direction of the board P, and z is a thickness direction of the board P, that is, the vertical direction of the lead component mounting machine. The x-direction, the y-direction, and the z-direction orthogonally intersect each other.

The component supplying device 14 supplies components to be mounted onto the board P, for example, the component supplying device 14 may include a plurality of tape feeders, may include a plurality of trays, and the like. In the present embodiment, a lead component in which a plurality of lead wires and a component main body are integrally formed is supplied.

The component insertion device 16 is provided above the board conveyance device 12, receives the lead component which is supplied in the component supplying device 14, and inserts the lead wires of the lead component into a through-hole which is provided in a predetermined position among a plurality of through-holes which are formed in the board P which is held by the board conveyance device 12. Description will be given of the component insertion device 16 later.

Figure 2:
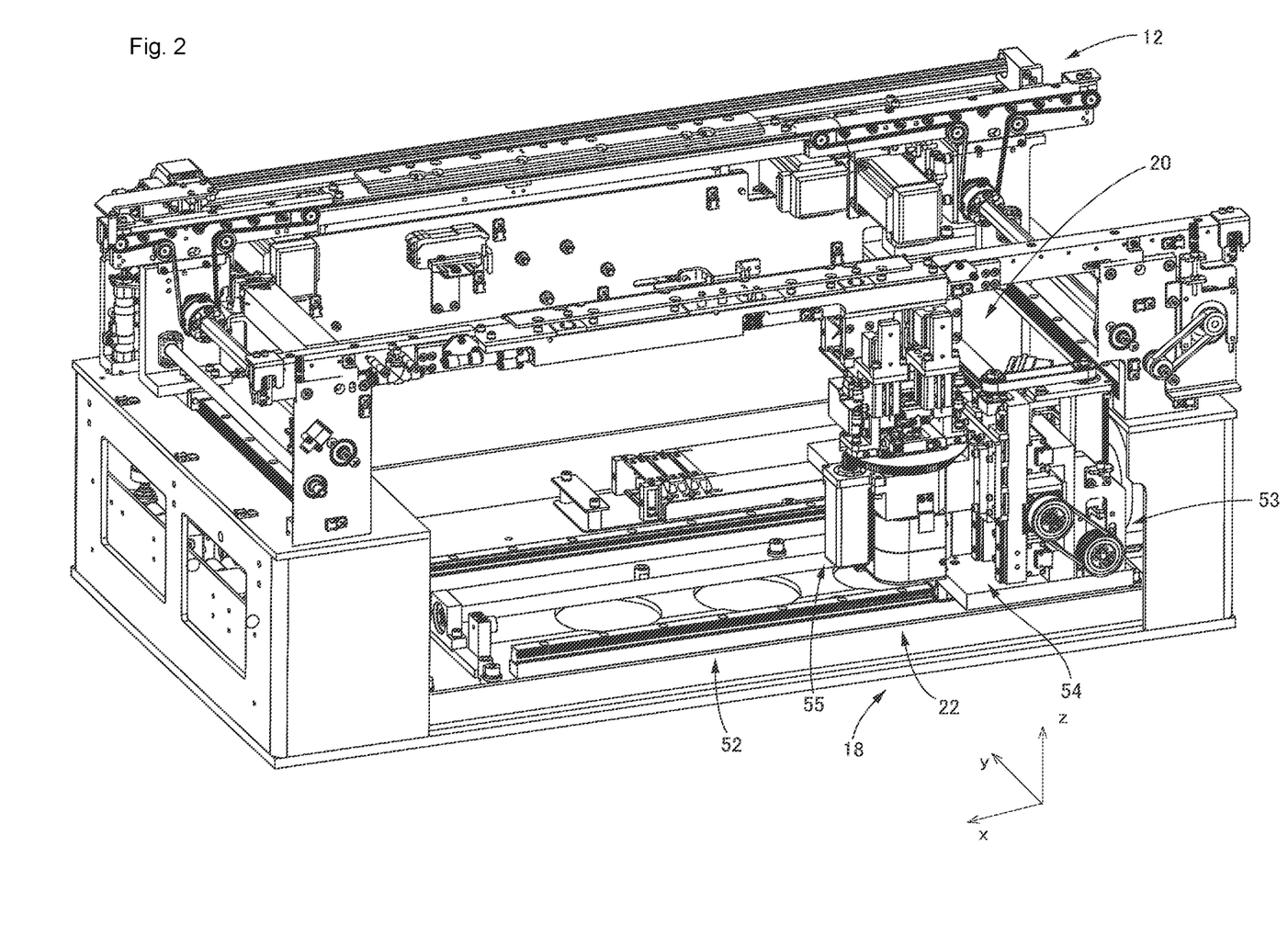
FIG. 2 is a perspective view of a cut-and-clinch device and a board conveyance device which are included in the lead component mounting machine.
Figure 3A:
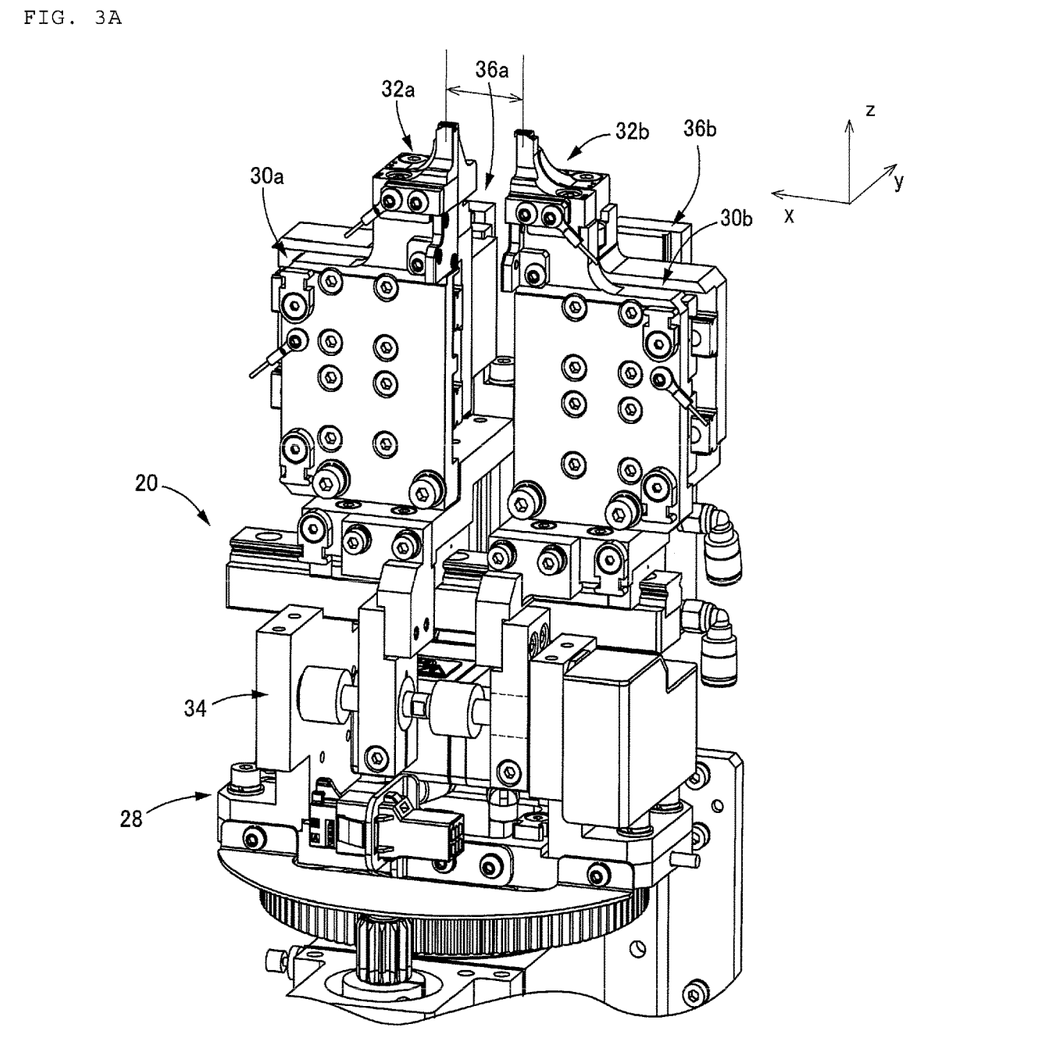
FIG. 3A is a perspective view of a cut-and-clinch unit which is included in the cut-and-clinch device.
Figure 3B:
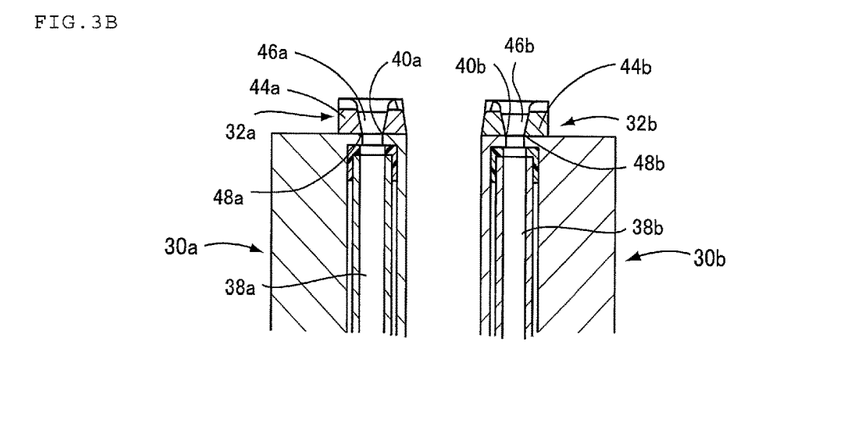
FIG. 3B is a sectional diagram of a portion of the cut-and-clinch unit.

The cut-and-clinch device 18 is a device which is provided under the board conveyance device 12, cuts a portion, which protrudes from the bottom (the other side) of the board P, of the lead wire of the lead component which is inserted from above (one side) into a predetermined through-hole of the plurality of through-holes which are formed in the board P to a predetermined length, bends the lead wire along the reverse surface of the board P, and thus, temporarily fixes the lead component to the board P. As illustrated in FIGS. 2 and 3, the cut-and-clinch device 18 includes a cut-and-clinch unit 20, and a unit moving device 22 which causes the cut-and-clinch device 20 to move (including linear movement and rotation).

As illustrated in FIG. 3A, the cut-and-clinch unit 20 includes (a) a unit main body 28, (b) a pair of first movable sections 30a and b which are held by the unit main body 28 to be capable of moving linearly in the horizontal direction, (c) a pair of second movable sections 32a and b which are held by the first movable sections 30a and b, respectively, to be capable of relative movement in the horizontal direction, (d) a pitch changing device 34 which is provided on the unit main body 28 and changes the interval (the pitch) between the pair of first movable sections 30a and b by causing the pair of first movable sections 30a and b to approach and separate in relation to each other, (e) movable blade driving devices 36a and b which cause the second movable sections 32a and b to move relative to the first movable sections 30a and b, respectively, and the like.

As illustrated in FIG. 3B, the pair of first movable sections 30a and b include lead wire insertion holes 38a and b which extend in the vertical direction. The lead wire insertion holes 38a and b include openings in the top end surfaces of the first movable sections 30a and b, and the opening edges thereof are stationary blades 40a and b. In comparison, the top end portions of the second movable sections 32a and b are substantially L-shaped and include a portion which extends upward and a portion which is bent approximately at a right angle thereto. Blade-forming sections 44a and b which are the portions which are bent at a right angle are positioned above the top end surfaces of the first movable sections 30a and b, and lead wire guide holes 46a and b which penetrate in the vertical direction are formed in portions facing the openings of the lead wire insertion holes 38a and b. The bottom end opening edges of the lead wire guide holes 46a and b of the blade-forming sections 44a and b are movable blades 48a and b. The lead wires which extend into the lead wire insertion holes 38a and b are cut and bent due to the pair of second movable sections 32a and b being caused to approach and separate in relation to each other by the movable blade driving devices 36a and b.

As illustrated in FIG. 2, the unit moving device 22 includes an x-direction moving device 52 which causes the cut-and-clinch unit 20 to move in the x-direction, a y-direction moving device which causes the cut-and-clinch unit 20 to move in the y-direction, a z-direction moving device 54 which causes the cut-and-clinch unit 20 to move in the z-direction, a θ-rotation device 55 which causes the cut-and-clinch unit 20 to rotate around a vertical line, and the like.

Figure 4:
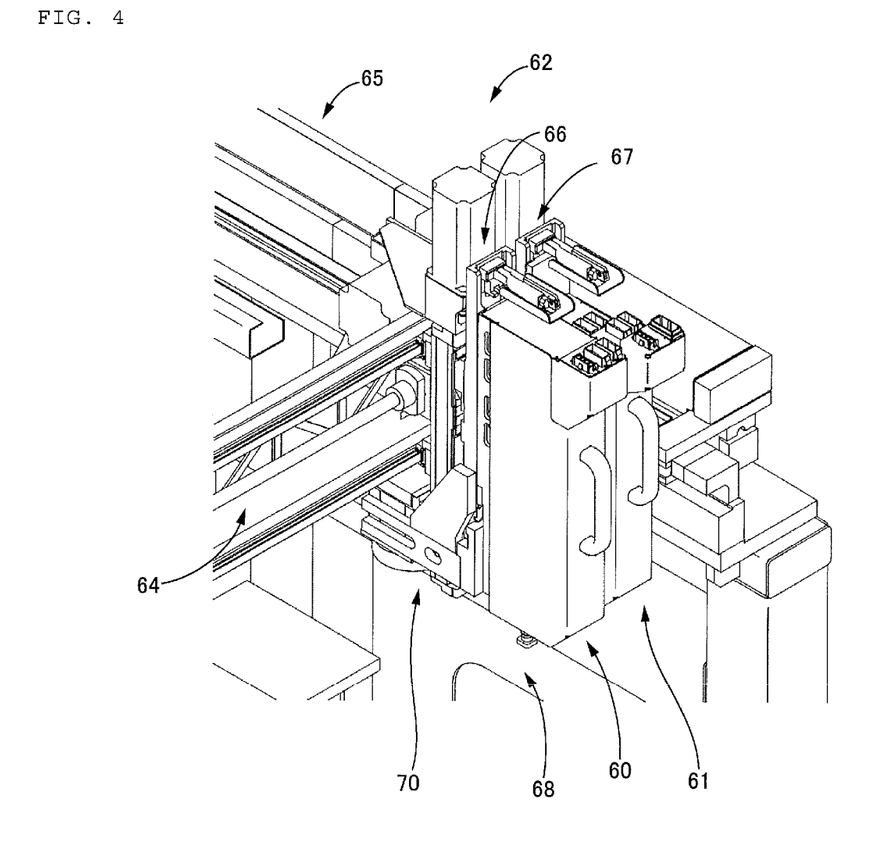
FIG. 4 is a perspective view illustrating a component insertion device which is included in the lead component mounting machine.

As illustrated in FIG. 4, the component insertion device 16 includes two work heads 60 and 61, and a work head moving device 62. The work head moving device 62 includes an x-direction moving device 64, a y-direction moving device 65, and z-direction moving devices 66 and 67. The work heads 60 and 61 are caused to move integrally to an arbitrary position in a horizontal plane by the x-direction moving device 64 and the y-direction moving device 65, and may be caused to move in the z-direction individually and independently by the z-direction moving devices 66 and 67, respectively. The work head 60, which is one of the two work heads, is provided with a component holding tool 68 (for example, it is possible to use a chuck, a suction nozzle, or the like) which holds the lead component. A camera 70 is provided to be capable of moving integrally with the work head 60.

Figures 5A, 5B:
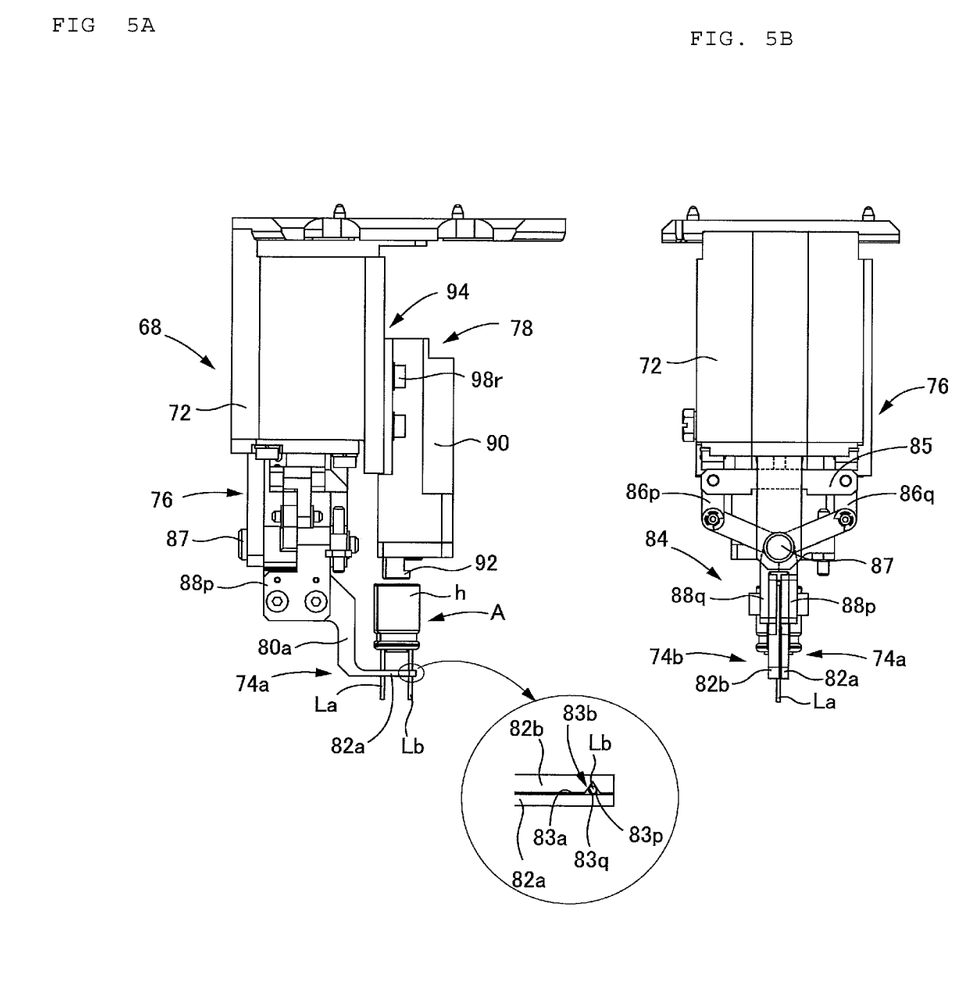
FIG. 5A is a side surface view of a chuck which is attached to a work head of the component insertion device.
FIG. 5B is a rear surface view of the chuck.
Figure 5C:
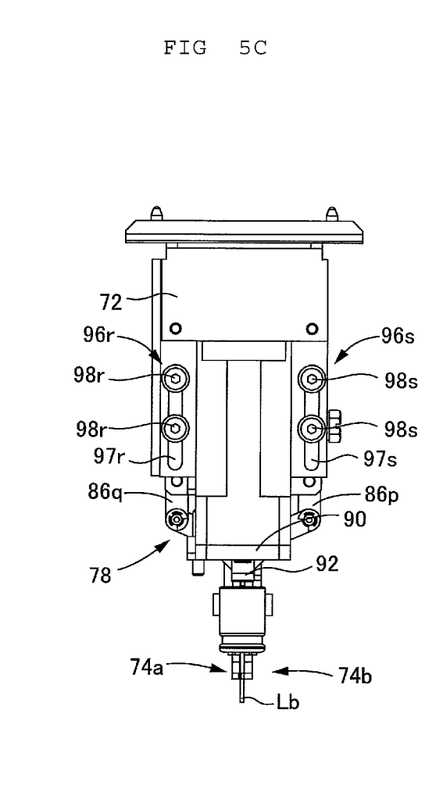
FIG. 5C is a front surface view of the chuck.

In the present embodiment, the chuck 68 illustrated in FIGS. 5A to C is attached as the lead component holding tool (which may also be referred to as a lead component mounting tool). The lead component A is a radial lead component, and two lead wires La and b are attached to a component main body h in parallel. The chuck 68 pinches and holds the two lead wires La and b of the lead component A from both sides in the direction in which the two lead wires La and b are lined up. The chuck 68 includes (a) a chuck main body 72, (b) a pair of pawl portions 74a and b which are attached to the chuck main body 72 to be swingable, (c) a swing device 76 which causes the pair of pawl portions 74a and b to swing, (d) a pushing-in device 78 which pushes in the lead component A, and the like.

The pawl portions 74a and b are substantially L-shaped, and include base end sections 80a and b which extend in the z-direction, and holding sections 82a and b which extend out from the base end sections 80a and b in a substantially horizontal direction. As illustrated in FIG. 5A, in plan view, a recessed section 83b which is recessed in a protruding shape on one of the mutually-facing sides of the holding sections 82a and b (in the present embodiment, the side of the holding section 82b which faces the holding section 82a), and the lead wires La and b are held in a state of being accommodated by the recessed section 83b in a state of being pinched by the pair of holding sections 82a and b. Specifically, since two surfaces 83p and q which form the recessed section 83b and another (the side of the holding section 82a which faces the holding section 82b) surface 83a are the contact surfaces of the lead wires La and b, the lead wires La and b are held by the friction force between the lead wires La and b and the three contact surfaces 83p, q, and 83a.

The swing device 76 includes an air cylinder as a driving source which is not illustrate, and a swing mechanism 84. The swing mechanism 84 includes (a) a driving member 85 which extends in the horizontal direction and is provided in a fixed manner on a rod which serves as an output member of the air cylinder, (b) two first members 86p and q which are joined to both end portions of the driving member 85 to be relatively swingable, (c) second members 88p and q which are substantially L-shaped, one end portion of each is joined to the two first members 86p and q to be swingable, the pawl portions 74a and b are fixed integrally to the other end portion to be swingable, and the middle portion is joined, to be swingable, to a swing shaft 87 which is provided on the chuck main body 72, and the like.

If the driving member 85 is caused to move in the z-direction by the air cylinder, the second members 88p and q are caused to swing around the swing shaft 87, and the pair of pawl portions 74a and b are caused to approach or separate in relation to each other. The pair of pawl portions 74a and b are caused to approach each other by causing the driving member 85 to move upward, and the pair of pawl portions 74a and b are caused to separate from each other by causing the driving member 85 to move downward. The approaching and separating of the pair of pawl portions 74*a* and *b* is controlled by controlling the air supply state of the air cylinder.

The pushing-in device 78 includes (a) a pushing-in device main body 90 which is provided on the chuck main body 72 to be capable of moving in the z-direction (capable of being lifted and lowered), (b) a pressing member 92 which is attached to the bottom end portion of the pushing-in device main body 90, and (c) a lifting and lowering device 94 which lifts and lowers the pushing-in device main body 90 in relation to the chuck main body 72. The lifting and lowering device 94, for example, may include an air cylinder which serves as a driving source which is not illustrated, and a pair of guide mechanisms 96*r* and *s* which are provided between the chuck main body 72 and the pushing-in device main body 90. The guide mechanisms 96*r* and *s* include the chuck main body 72, long holes 97*r* and *s* which are provided on both end portions in the horizontal direction of the pushing-in device main body 90 and extend in the z-direction, and two each of engaging protruding sections 98*r* and *s* which are attached to the chuck main body 72, and the long holes 97*r* and *s* and the engaging protruding sections 98*r* and *s* are engaged with each other to be capable of relative movement. It is possible to cause the pushing-in device main body 90 to be lifted and lowered along the guide mechanisms 96*r* and *s*, and to cause the pressing member 92 to be lifted and lowered by controlling the air supply state in the air cylinder which is the driving source.

The swing device 76 and the lifting and lowering device 94 are not limited to using air cylinders as driving sources, and may include electric motors or the like.

Figure 6:
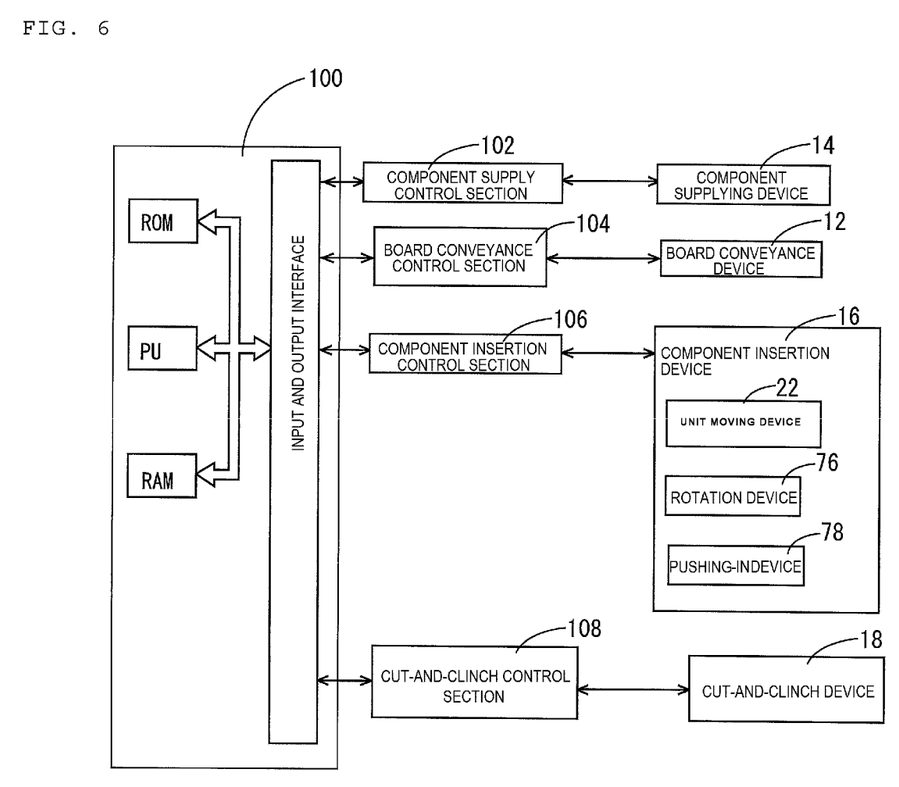
FIG. 6 is a block diagram conceptually illustrating a control device of the lead component mounting machine.

As illustrated in FIG. 6, the lead component mounting machine is controlled by a main control device 100, the main constituent of which is a computer. A component supply control section 102, a board conveyance control section 104, a component insertion control section 106, a cut-and-clinch control section 108, and the like, the main constituent of which is a computer, are connected to the main control device 100 to be capable of mutual communication. The control sections 102 to 108 control the component supplying device 14, the board conveyance device 12, the component insertion device 16, and the cut-and-clinch device 18 described earlier, respectively.

In the lead component mounting machine, it is not essential to provide a control section for each device such as the component supplying device 14, all of the devices may be controlled based on commands of the main control device 100, or the like, and the configuration of the control device is not limited to that described in the present embodiment.

In the lead component mounting machine, from above the board P which is conveyed by the board conveyance device 12, the two lead wires La and b of the lead component A are inserted by the component insertion device 16 into two through-holes Qa and b which are formed in predetermined positions on the board P. Meanwhile, the two lead wires La and b are cut and bent at a predetermined length in the below of the board P by the cut-and-clinch device 18.

Cut-and-Clinch Operation Described in PTL 2

Figure 8A:
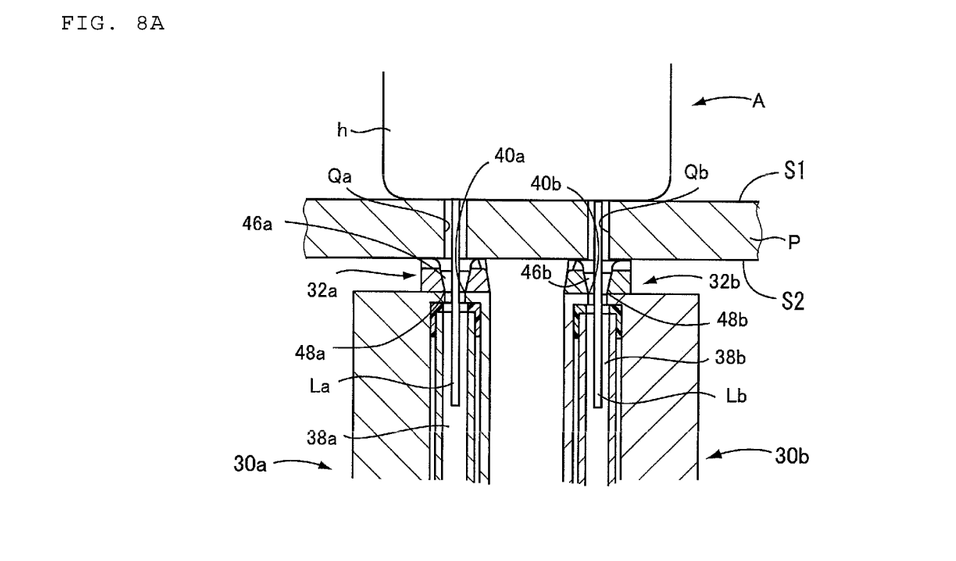
FIGS. 8A to 8B are diagrams illustrating forces acting on a lead component A in a case in which cutting and clinching is performed by the cut-and-clinch device.
Figure 8B:
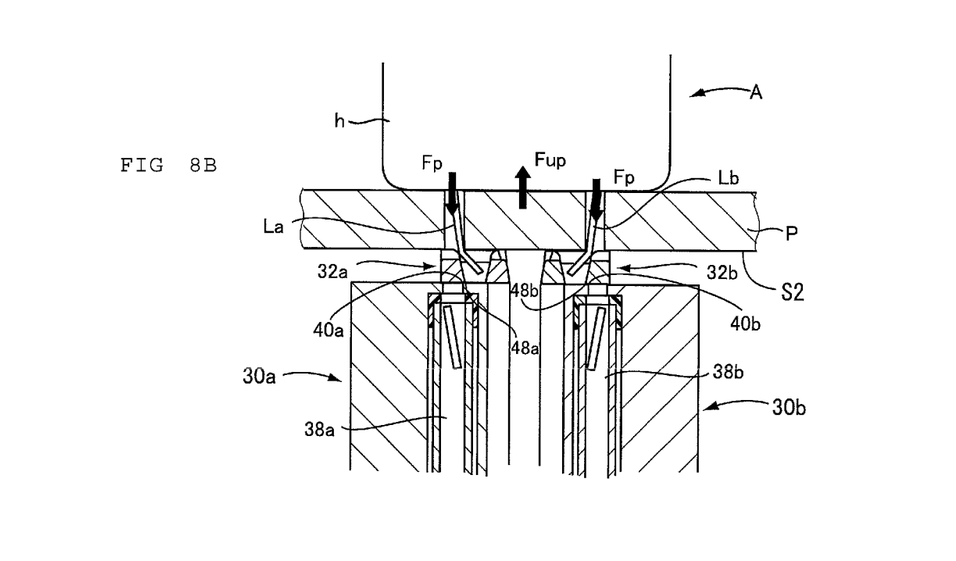

In the lead component mounting machine described in PTL 2, as illustrated in FIGS. 8A and B, the component main body h of the lead component A is pushed in by the pushing-in device 78 until coming into contact with an upper surface S1 of the board P, and in this state, the cutting and clinching is performed. In the cut-and-clinch device 18, the second movable sections 32*a* and *b* are caused to move in the horizontal direction. The lead wires La and b are cut by the stationary blades 40*a* and *b* and the movable blades 48*a* and *b*, and the lead wires La and b are bent by an opening peripheral portion of the lead wire guide holes 46*a* and *b* of the second movable sections 32*a* and *b* and a bottom surface S2 of the board P. However, the top end surfaces of the second movable sections 32*a* and *b* are in positions in close proximity to the bottom surface S2 of the board P. The lead wires La and b have a thickness (a diameter), and there is a gap between the lead wires La and b and the through-holes Qa and b. Therefore, in a case in which the lead wires La and b are bent, a downward tensile force acts on the lead wires La and b, while an upward pushing up force Fup acts on the board P, and the upward pushing up force Fup acts on the component main body h. Therefore, a large downward force acts on the attachment section periphery of the lead wires La and b of the component main body h, and a large load is applied to the lead component A. For example, in a case in which the strength of the component main body h is low, the attachment section periphery or the like of the component main body h may be damaged. In a case in which the attachment strength of the lead wires La and b in relation to the component main body h is low, the lead wires La and b may become detached.

Cut-and-Clinch Operation Described in Present Embodiment

Figure 7A:
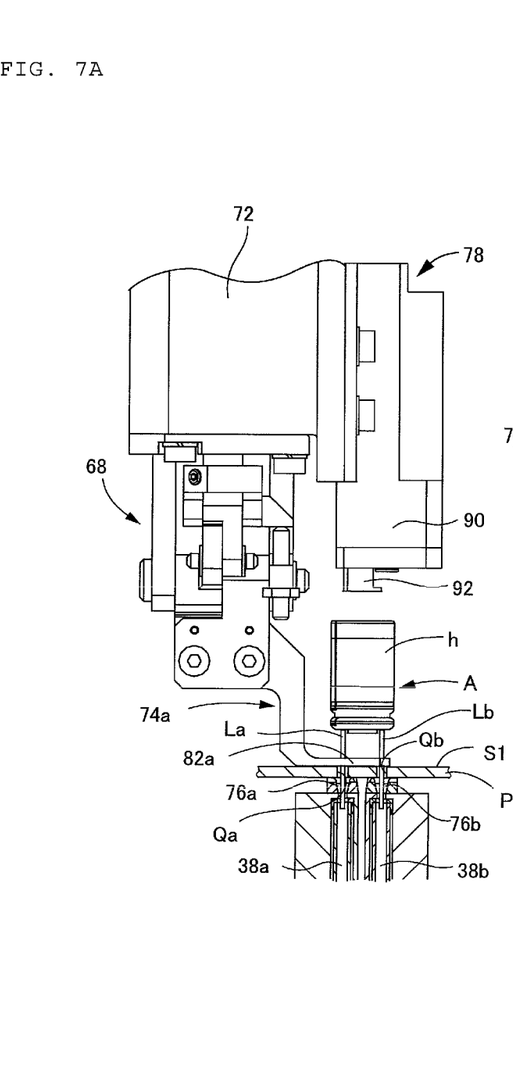
FIGS. 7A to 7C are diagrams of operations of the chuck and the cut-and-clinch device.
Figure 7B:
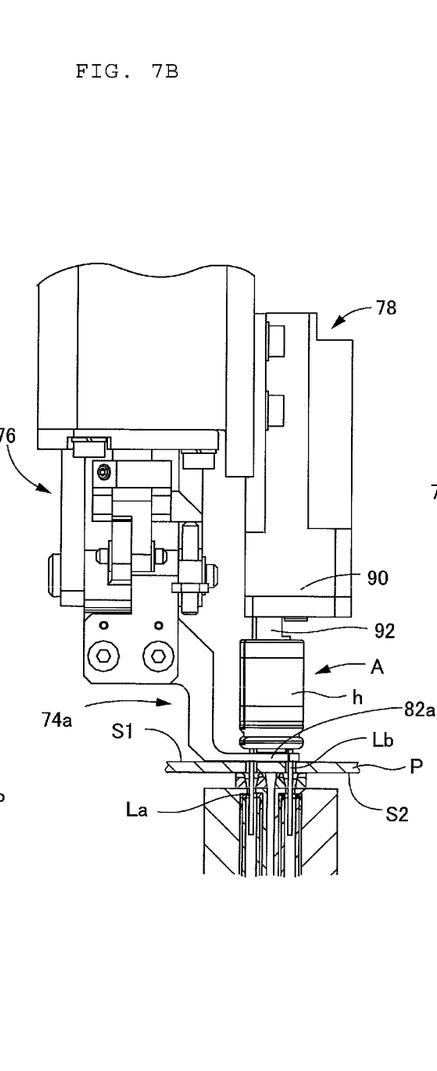
Figure 7C:
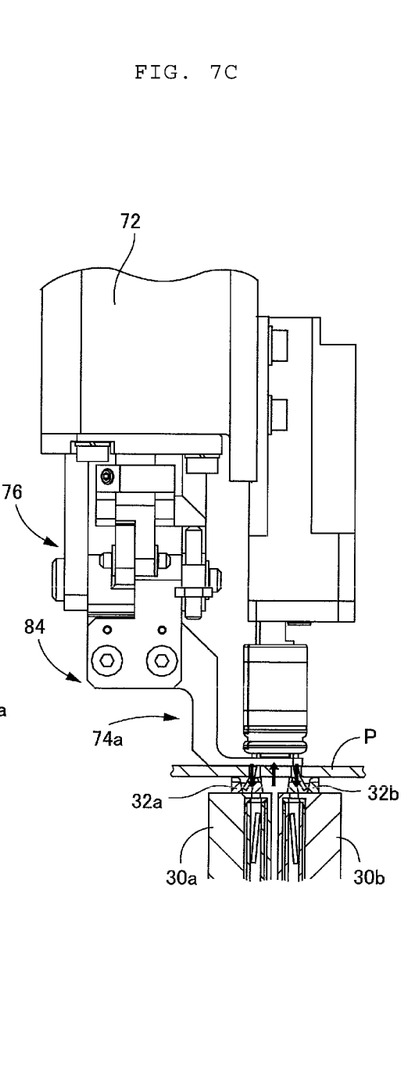

In comparison, in the present embodiment, as illustrated in FIGS. 7A to C, the cutting and clinching is performed in a state in which the lead wires La and b are pinched from both sides at a portion which is higher than the board P by the chuck 68.

(1) As illustrated in FIG. 7A, after the lead wires La and b are inserted by the chuck 68 into the two through-holes Qa and b, respectively, which are formed in predetermined positions on the board P, the chuck 68 is lowered until the bottom surfaces of the holding sections 82*a* and *b* of the pair of pawl portions 74*a* and *b* come into contact with the upper surface S1 of the board P. The lead wires La and b reach the lead wire insertion holes 38*a* and *b* via the lead wire guide holes 46*a* and *b* of the cut-and-clinch device 18.

(2) The swing angle of the pair of pawl portions 74*a* and *b* is rendered slightly larger under the control of the swing device 76. The holding of the lead wires La and b by the pair of pawl portions 74*a* and *b* is loosened, and the holding strength is set to less than or equal to a set strength, that is, to a degree which allows the relative movement (sliding) of the lead wires La and b in relation to the pawl portions 74*a* and *b*. As illustrated in FIG. 7B, the pressing member 92 is caused to move downward under the control of the pushing-in device 78. While the lead wires La and b are caused to slide in relation to the holding sections 82*a* and *b*, the lead component A is caused to move downward until the bottom surface of the component main body h comes into contact with the upper surfaces of the holding sections 82*a* and *b* of the pawl portions 74*a* and *b*.

(3) The swing angles of the pair of pawl portions 74*a* and *b* are reduced under the control of the swing device 76, and the lead wires La and b are held strongly. The holding strength of the pair of pawl portions 74*a* and *b* is set to a degree at which the relative movement (sliding) of the lead wires La and b in relation to the holding sections 82*a* and *b* is suppressed adequately as a result of the cutting and clinching operation.

(4) As illustrated in FIG. 7C, the lead wires La and b are cut and bent by the cut-and-clinch device 18. In this case, although the pushing up force Fup acts on the board P and a tensile force Fp is applied to the lead wires La and b, since the lead wires La and b are in a state of being pinched and held by the pair of pawl portions 74*a* and *b*, the tensile force Fp is rendered difficult to transmit to the component main body side, that is, the tensile force Fp is rendered difficult to transmit to the attachment sections of the lead wires La and b in relation to the component main body h. The pushing up force Fup from the board P acts on the holding sections $82a$ and $b$ of the pawl portions $74a$ and $b$, and the pushing up force Fup is received by the chuck main body 72 via the pawl portions $74a$ and $b$ and the swing mechanism 84. As a result, the pushing up force Fup is rendered difficult to transmit to the component main body h.

In this manner, since the cutting and clinching is performed in a state in which the lead wires La and b are pinched by the pair of pawl portions $74a$ and $b$, it is possible to reduce the force of the lead wires La and b acting on the attachment section periphery of the component main body h, and it is possible to reduce the load applied to the lead component A.

Accordingly, even if the attachment strength of the lead wires La and b to the component main body h is low, it is possible to render the lead wires La and b difficult to detach from the component main body h. Even if the strength of the component main body h is low, it is possible to render the component main body h difficult to damage at the attachment section periphery.

Even in a case in which the component main body h is fragile and it is difficult to push in the component main body h using the pushing-in device 78, since the cutting and clinching is performed in a state in which the lead wires La and b are held by the pair of pawl portions $74a$ and $b$, the lead component A inclining during the cut-and-clinch operation is avoided, and it is possible to perform the cutting and clinching in a state in which the posture of the lead component A is maintained.

(5) After the cutting and clinching is completed, the pressing member 92 is moved upward, the pair of pawl portions $74a$ and $b$ are opened, and the holding of the lead wires La and b is released. Although there is a case in which the component main body h slips down by the thickness amount of the pawl portions $74a$ and $b$, the slipping down amount is small. After the cut-and-clinch operation, there is a case in which a gap is filled by soldering or the like being performed.

In the present embodiment, a pawl portion movement control section, and a pushing-in device control device are configured by the component insertion control section 106 and the like. The operation of (1) which is described above and illustrated in FIG. 7A corresponds to a component insertion process, and the operation of (4) which is described above and illustrated in FIG. 7C corresponds to the cutting and clinching process.

Figure 9A:
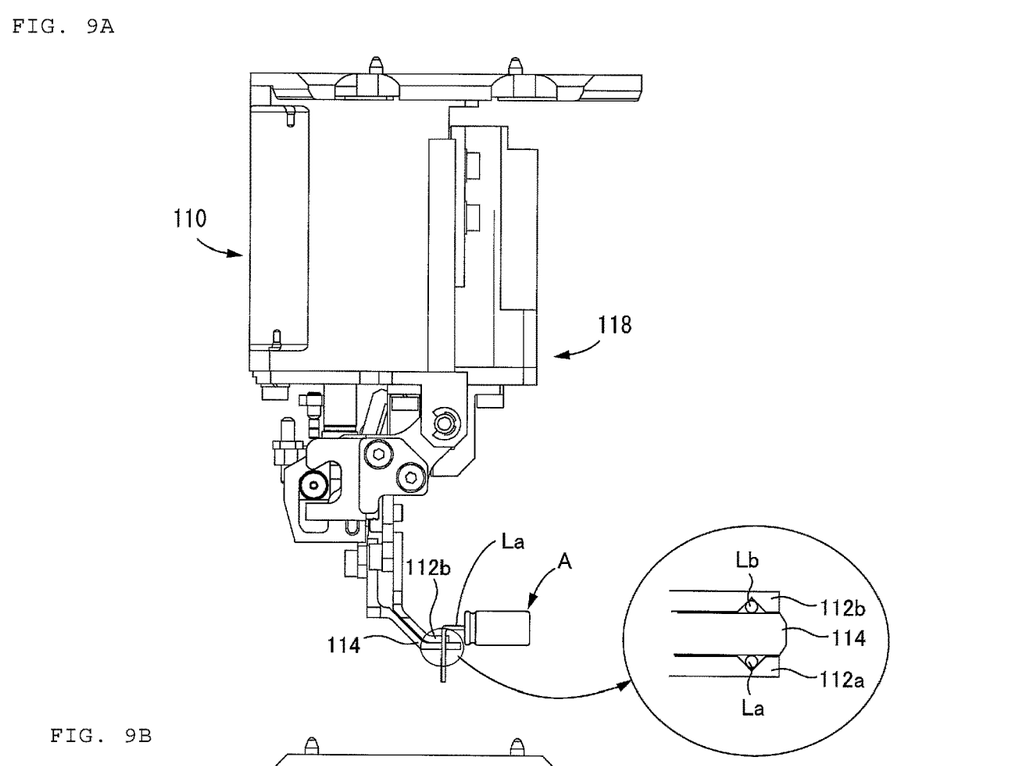
FIG. 9A is a side surface view of a different chuck which is attached to the work head.
Figure 9B:
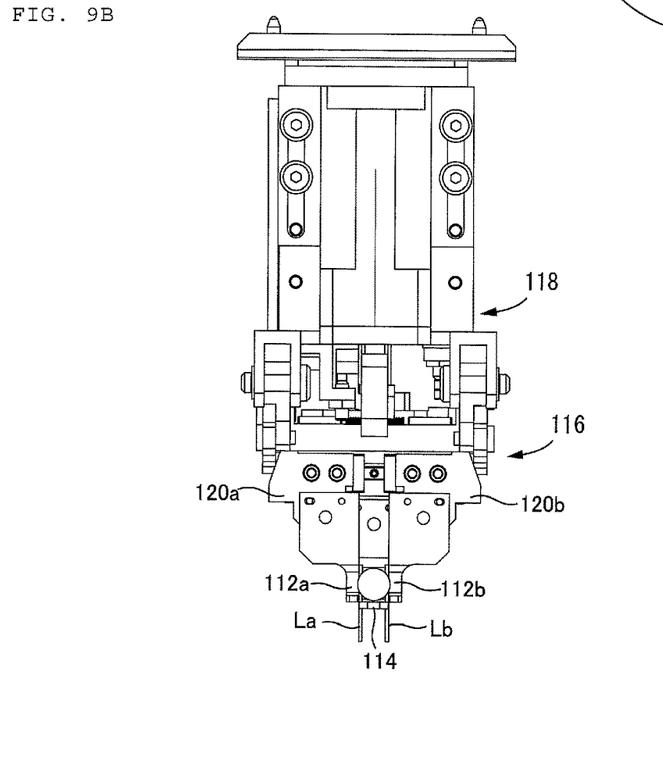
FIG. 9B is a front surface view of the chuck.

The lead component holding tool may be the one which has the structure illustrated in FIGS. 9A and B.

In the present embodiment, a chuck 110 is attached as the lead component holding tool. The chuck 110 is a slide-type chuck, and includes (a) a pair of pawl portions $112a$ and $b$ which are capable of approaching and separating in relation to each other, (b) a spacer 114 which is positioned between the pair of pawl portions $112a$ and $b$, (c) an approaching and separating device 116 which causes the pair of pawl portions $112a$ and $b$ to approach and separate, (d) a pushing-in device 118, and the like. The approaching and separating device 116 includes a driving source such as an air cylinder which is not illustrated, a pair of sliders $120a$ and $b$ which are caused to approach and separate in relation to each other in the horizontal direction by the driving source, and the like, and the pawl portions $112a$ and $b$ are attached to the pair of sliders $120a$ and $b$ to be capable of moving integrally therewith. As illustrated in FIG. 9A, the spacer 114 is positioned between the two lead wires La and b of the lead component A, and the width of the spacer 114 is a size corresponding to the interval between the lead wires La and b of the lead component A. For the spacer 114, a spacer with an appropriate shape for the lead component A is attached.

As illustrated in FIG. 9A, in the present embodiment, in plan view, a protrusion-shaped recessed section is provided on the spacer side of each of the pair of pawl portions $112a$ and $b$, and the lead wires La and b are held by the pawl portions $112a$ and $b$ and the spacer 114 in a state of being stored in the recessed section. Each of the two lead wires La and b is held in a state of being pinched from both sides by the spacer 114 and the pawl portions $112a$ and $b$, that is, by the two pawl portions ($112a$, 114), and ($112b$, 114).

The shape of the lead component which is mounted by the present lead component mounting machine is not an issue. For example, the lead component may have three or more lead wires. In this case, two of the three or more lead wires are cut and clinched in a state of being pinched and held by one pair or two pairs of pawl portions.

In a case in which the lead wires of the lead component are short or the like, the lead wires may be bent without being cut by the cut-and-clinch device. In a case in which the lead wires do not reach the cutting section included in the cut-and-clinch device, the lead wires are bent without being cut.

REFERENCE SIGNS LIST

16: component insertion device, 18: cut-and-clinch device, 30: first movable section, 32: second movable section, 68: chuck, $74a$ and $b$: pawl portion, 76: swing device, 78: pushing-in device, $82a$ and $b$: clamping section, $112a$ and $b$: pawl portion, 114: spacer

The invention claimed is:

1. A lead component mounting method, comprising:
   inserting two lead wires of the lead component into two corresponding through-holes which are formed in a circuit board from a first side of the circuit board in a state in which a pair of pawl portions pinches and holds each of the two lead wires; and
   bending protruding portions, which are portions protruding from a second side of the circuit board, of the two lead wires which are inserted into the two corresponding through-holes, in a state in which the two lead wires are held by the pair of pawl portions,
   wherein the pair of pawl portions includes base end sections which extend in a thickness direction of the circuit board, and holding sections which extend out from the base end sections in a horizontal direction,
   wherein a swing device causes the pair of pawl portions to swing, the swing device including
      a driving member which extends in the horizontal direction and is provided in a fixed manner on a rod which is an output member of a driving source of the swing device
      a pair of first members which are joined to end portions of the driving member to be relatively swingable, and
      a pair of second members, first ends of the second members being joined to the first members to be swingable, the pair of pawl portions being fixed integrally to second ends of the second members, and a middle portion of the second members being swingably joined to a swing shaft, wherein movement of the driving member of the swing device along the thickness direction of the circuit board causes the second members of the swing device to swing around the swing shaft and causes the pair of pawl portions to approach or separate relative to each other, and wherein during the inserting, the pair of pawl portions are lowered until bottom surfaces of the holding sections come into contact with an upper surface of the circuit board, then the swing device renders a swing angle of the pair of pawl portions larger to cause the lead component to move downward until a bottom surface of the component main body comes into contact with upper surfaces of the holding sections, then the swing device reduces the swing angle of the pair of pawl portions.

\* \* \* \* \*